United States Patent [19]

Harada et al.

[11] Patent Number: 4,867,859
[45] Date of Patent: Sep. 19, 1989

[54] APPARATUS FOR FORMING A THIN FILM

[75] Inventors: Shigeru Harada; Takeshi Noguchi; Hiroshi Mochizuki, all of Itami, Japan

[73] Assignee: Mitsubishi Denki Kabushiki Kaisha, Japan

[21] Appl. No.: 81,450

[22] Filed: Aug. 4, 1987

[30] Foreign Application Priority Data

Aug. 6, 1986 [JP] Japan ................... 61-185741

[51] Int. Cl.$^4$ ................... C23C 14/24; C23C 14/34
[52] U.S. Cl. ................... 204/298; 118/50.1; 118/719; 118/723
[58] Field of Search ............ 204/298; 118/719, 723, 118/50.1

[56] References Cited

U.S. PATENT DOCUMENTS 4,572,842 2/1986 Dietrich et al. ................... 427/39

OTHER PUBLICATIONS

J. L. Vossen, Thin Film Processes, Academic Press, New York, 1978, pp. 189–193, 195–198.
"Electrical Characteristics of TiN Contacts to N Silicon", Wittmer et al, Journal of Applied Physics, vol. 52(9), Sep. 1981.
"TiN Formed by Evaporation as a Diffusion Barrier Between Al and Si", Ting, J. Vac. Sci. Technol., 21(1), May/Jun. 1982.

Primary Examiner—John F. Niebling
Assistant Examiner—William T. Leader
Attorney, Agent, or Firm—Leydig, Voit & Mayer

[57] ABSTRACT

An apparatus for forming a thin film on a substrate has a first reaction chamber in which a thin film is formed by gaseous discharge and a second reaction chamber in which reactive atoms are generated. The first and second reaction chambers commuicate with one another through an orifice in the first reaction chamber. The first reaction chamber houses a device for generating a film on a substrate, and the second reaction chamber houses a device for generating reactive atoms. The orifice is disposed in the vicinity of both a film-forming region in the first reaction chamber and a reactive atom-generating region in the second reaction chamber so that reactive atoms from the second reaction chamber will pass through the orifice and enter the film-forming region in the first reaction chamber, combine with particles in the film-forming region to form a chemical compound, and accumulate on the substrate. In preferred embodiments, the reaction chambers are formed by a single housing having a partition which has an orifice therein and which divides the housing into two reaction chambers.

9 Claims, 6 Drawing Sheets

APPARATUS FOR FORMING A THIN FILM

BACKGROUND OF THE INVENTION

This invention relates to an apparatus for forming a thin film on a substrate, and more particularly, it relates to an apparatus which can form multi-layer films employing reactive sputtering.

A conventional film-forming apparatus of the type to which the present invention relates has a single reaction chamber which houses an anode and a cathode between which a direct current voltage is applied. The anode serves as a support for a substrate on which a thin film is to be formed. After evacuating the reaction chamber, a rare gas (typically argon) is introduced into the reaction chamber, and a gaseous discharge is produced by applying a high voltage between the electrodes. The rare gas ions which are formed by the gaseous discharge strike the cathode, and particles of the material which constitutes the cathode are sputtered into the reaction chamber and accumulate as a thin film on the substrate.

Reactive sputtering is a form of sputtering used to form thin films of chemical compounds such as oxides or nitrides on a substrate. Both a rare gas such as argon and a reactive gas such as oxygen or nitrogen are introduced into an evacuated reaction chamber. As in the above-described method, a high voltage is applied between a cathode and an anode, which supports a substrate, and rare gas ions which strike the cathode cause particles of the material constituting the cathode to be sputtered from therefrom. The sputtered particles combine with the reactive gas to form a compound, which then accumulates on the substrate as a thin film.

It is often desired to form a multi-layer thin film on a substrate. For example, in one type of multi-layer film, a first layer of a chemical compound (which will be referred to as a chemical compound thin film) is formed on a substrate by reactive sputtering, and then a second layer of a material in elemental form (which will be referred to as an elemental thin film) is formed atop the first layer using some other film-forming method. When using a conventional film-forming apparatus, after the chemical compound thin film is formed on a substrate by reactive sputtering in a reaction chamber, the gas in the reaction chamber must be completely evacuated prior to forming the elemental thin film, since if any of the reactive gas remains in the reaction chamber while the elemental thin film is being formed, the reactive gas will end up in the elemental thin film and will adversely affect its properties. However, evacuating the reaction chamber between the steps of forming the two layers is troublesome, time-consuming, and decreases productivity.

Furthermore, because of the need to evacuate the reaction chamber before forming the elemental thin film, the chemical compound thin film is left exposed in a vacuum for a considerable length of time. The exposure decreases the stability of the interface between the chemical compound thin film and the elemental thin film, often resulting in the undesirable peeling or swelling of the elemental thin film.

SUMMARY OF THE INVENTION

Accordingly, it is an object of the present invention to provide an apparatus for forming a thin film which enables a multi-layer thin film to be more easily and more quickly formed on a substrate than is possible using a conventional film-forming apparatus.

It is another object of the present invention to provide an apparatus for forming a thin film which can produce a multi-layer thin film consisting of an elemental thin film formed atop a chemical compound thin film which is not subject to the peeling or swelling of the elemental thin film.

It is still another object of the present invention to provide an apparatus for forming a thin film which can be used for reactive sputtering as well as a variety of other film-forming methods.

An apparatus for forming a thin film in accordance with the present invention has a first reaction chamber and a second reaction chamber which communicate through an orifice. The first reaction chamber houses film-forming means for forming a film on a substrate, and the second reaction chamber houses reactive atom generating means for generating reactive atoms for use in reactive sputtering. The orifice which connects the two reaction chambers is positioned in the vicinity of the film-forming means in the first reaction chamber and the reactive atom generating means in the second reaction chamber so that reactive atom which are generated in the second reaction chamber can pass through the orifice and enter a film-forming region in the first reaction chamber to combine with particles in the film-forming region and form a chemical compound.

In preferred embodiments, the reactive atom generating means of the second reaction chamber comprises an anode and a cathode between which a high-frequency voltage is applied in the presence of a rare gas. The cathode is formed from a material containing reactive atoms in its molecules. When a gaseous discharge is generated between the two electrodes, reactive atoms are sputtered from the cathode.

The film-forming means of the first reaction chamber is not restricted to any one device. In various preferred embodiments, it is in the form of a sputtering device, an ion plating device, a vacuum deposition device, an ion beam sputtering device, an ion beam vapor deposition device, a cluster ion beam vapor deposition device, and a molecular beam epitaxy device.

In preferred embodiments, the reaction chambers are formed by a single housing which is divided into two chambers by a partition having an orifice formed therein, one of the chambers serving as the first reaction chamber and the other chamber serving as the second reaction chamber.

BRIEF DESCRIPTION OF THE DRAWINGS

In the drawings, the same reference numerals indicate the same or corresponding parts.

DESCRIPTION OF THE PREFERRED EMBODIMENTS

Figure 1:
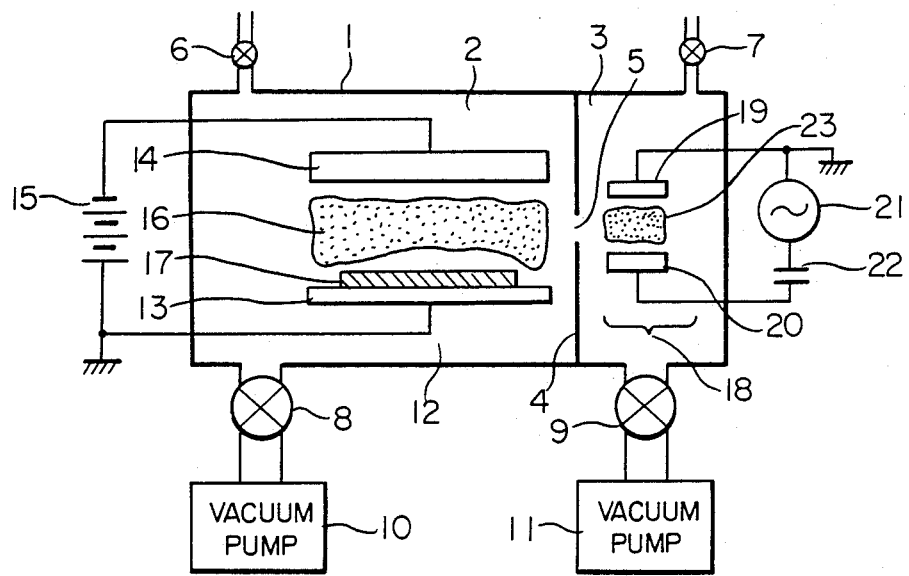
FIG. 1 is a schematic view of a first embodiment of an apparatus for forming a thin film in accordance with the present invention in which the film-forming means is in the form of a sputtering device.

Hereinbelow, a number of preferred embodiments of an apparatus for forming a thin film in accordance with the present invention will be described while referring to the accompanying drawings, FIG. 1 of which schematically illustrates a first embodiment. As shown in this figure, a housing 1 is divided by a partition 4 into a first reaction chamber 2 and a second reaction chamber 3 which communicate with one another via an orifice 5 formed in the partition 4. The reaction chambers 2 and 3 are respectively equipped with intake valves 6 and 7 through which a rare gas can be introduced, and exhaust valves 8 and 9 through which the reaction chambers can be evacuated. The exhaust valves 8 and 9 are respectively connected to vacuum pumps 10 and 11 such as cryopumps for producing vacuums in the two reaction chambers.

The first reaction chamber 2 houses a film-forming means in the form of a sputtering device 12. The sputtering device 12 comprises an anode 13 and a cathode 14 which are connected to a high-voltage, direct current power supply 15 and which confront one another across a prescribed gap. The anode 13 supports a substrate 17 upon which a thin film is to be formed. The cathode 14, which serves as a target for rare gas ions, is made from a material containing an element in its molecules which is to be included in the thin film to be formed on the substrate 17. In the present embodiment, the cathode 14 is made from a material containing titanium.

The second reaction chamber 3 houses a reactive atom generating device 18 which comprises an anode 19 and a cathode 20 which confront one another across a prescribed gap, and a high-frequency, high-voltage power supply 21 and a self-biasing capacitor 22 which are connected in series with the electrodes 19 and 20. The cathode 20 is made of a material containing nitrogen, such as SiN, TaN, or AlN which will generate atoms of nitrogen by sputtering when bombarded by rare gas ions.

The operation of the illustrated embodiment will now be explained for the case in which a two-layer thin film comprising a chemical compound thin layer in the form o a TiN thin film (the lower layer) and an elemental thin layer in the form of a Ti thin film (the upper layer) is formed on the substrate 17, although many other types of multi-layer thin films can be formed using this embodiment. First, both of the reaction chambers 2 and 3 are pumped down to a pressure on the order of $1 \times 10^{-6} - 1 \times 10^{-7}$ Torr through the exhaust valves 8 and 9 using the vacuum pumps 10 and 11, respectively. The intake valves 6 and 7 are then opened, and a rare gas such as argon, which has a relatively high sputtering efficiency and is relatively inexpensive, is introduced into both reaction chambers. Using power supply 15, a large direct current voltage is applied between the electrodes 13 and 14 in the first reaction chamber 2, and using power supply 21, a large, high-frequency voltage is applied between the electrodes 19 and 20 in the second reaction chamber 3, thereby producing gaseous discharges in both reaction chambers. A film-forming region 16 is created between electrodes 13 and 14 in the first reaction chamber 2, and a reactive atom generating region 23 is created between electrodes 19 and 20 in the second reaction chamber 3. Rare gas ions in the second reaction chamber 3 collide with the cathode 20, causing silicon and nitrogen atoms to be sputtered therefrom. Some of the sputtered Si atoms will accumulate on the anode 19 while being scattered by the rare gas ions, and a portion will react with some of the sputtered N atoms to form SiN particles which also accumulate on the anode 19. Many of the sputtered nitrogen atoms will stop within the reactive atom generating region 23.between the two electrodes, from which they will pass into the first reaction chamber 2 via the orifice 5 and diffuse into the film-forming region 16 between the electrodes 13 and 14 in the first reaction chamber 2.

In the first reaction chamber 2, rare gas ions collide with the cathode 14, causing titanium atoms to be sputtered therefrom. The sputtered titanium atoms react with the nitrogen atoms from the second reaction chamber 3 to form particles of TiN, which accumulate as a chemical compound (TiN) thin film on the substrate 17.

After the formation of the TiN thin film on the substrate 17, the high-frequency power supply 21 is turned off, thereby stopping the generation of nitrogen atoms. The second reaction chamber 3 is then evacuated by vacuum pump 11 to get rid of all remaining nitrogen atoms. A rare gas is then introduced into the second reaction chamber 3 via intake valve 7, and a Ti thin film is formed a top the TiN thin film by sputtering of Ti atoms from the cathode 14. After forming the TiN thin film and prior to forming the Ti thin film, it is not necessary to evacuate the first reaction chamber 2, and as the second reaction chamber 3 is separated therefrom by the partition 4, the atmosphere within the first reaction chamber 2 is relatively unaffected when the second reaction chamber 3 is evacuated in order to remove residual nitrogen atoms. Thus, there is less time delay between the steps of forming the TiN thin layer and the Ti thin layer, and the TiN layer is not left exposed in a vacuum as in a conventional apparatus. As a result, the process of film formation is faster and simpler, resulting in increased productivity, and the stability of the interface between the TiN thin film and the Ti thin film is increased, so that there is no peeling or swelling of the Ti thin film.

The reactive atom generating device 18 enables the amount of reactive atoms which are supplied to the first reaction chamber 2 to be precisely controlled, so it is possible to form a thin film containing only a minute quantity of reactive atoms on the substrate 17. Also, as the orifice 5 in the partition 4 is located in the vicinity of both the film-forming region 16 and the reactive atom generating region 23, a small quantity of reactive atoms can be efficiently supplied to the film-forming region 16.

Figure 2:
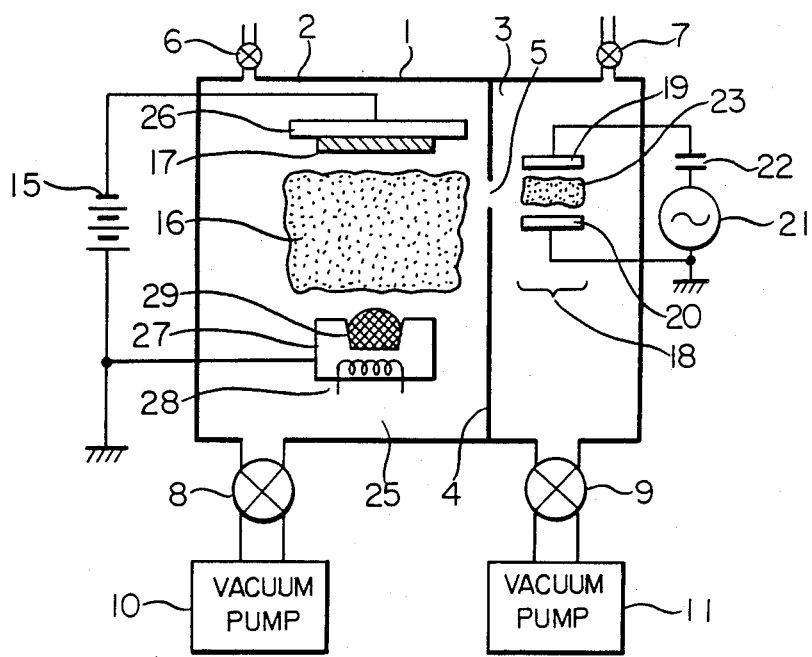
FIG. 2 is a schematic view of a second embodiment of the present invention in which the film-forming means is in the form of an ion plating device.

FIG. 2 schematically illustrates a second embodiment of the present invention which differs from the first embodiment in that the means for forming a thin film in a first reaction chamber 2 is an ion plating device 25. A cathode 26 which supports a substrate 17 is connected to a high-voltage direct current power supply 15 and confronts a grounded crucible 27 which contains a vapor deposition material 29. The crucible 27 is equipped with a heater 28 for heating the vapor deposition material 29. During operation of this embodiment, a film-forming region 16 is created between the cathode 26 and the crucible 27 in the vicinity of an orifice 5, and reactive gas atoms from a second reaction chamber 3 enter the film-forming region 16, combine with atoms of the vapor deposition material 29, and form a chemical compound which accumulates on the substrate 17 in the form of a thin film. The structure of this embodiment is otherwise the same as that of the embodiment of FIG. 1, and it provides the same effects.

Figure 3:
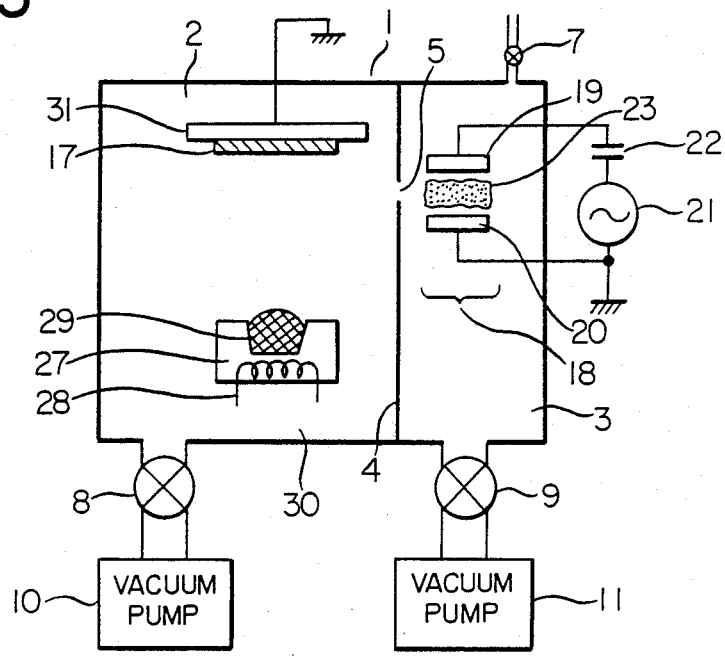
FIG. 3 is a schematic view of a third embodiment of the present invention in which the film-forming means is in the form of a vacuum deposition device.

FIG. 3 schematically illustrates a third embodiment of the present invention in which the means for forming a thin film is in the form of a vacuum deposition device 30 which is housed within a first reaction chamber 2. The vacuum deposition device 30 comprises a grounded substrate holder 31 which supports a substrate 17, a crucible 27 which contains a vapor deposition material 29, and a heater 28 for heating the crucible 27. In this embodiment, the first reaction chamber 2 does not need to be equipped with an intake valve for rare gas, but the structure is otherwise identical to that of the embodiment of FIG. 1, and the same effects are obtained.

Figure 4:
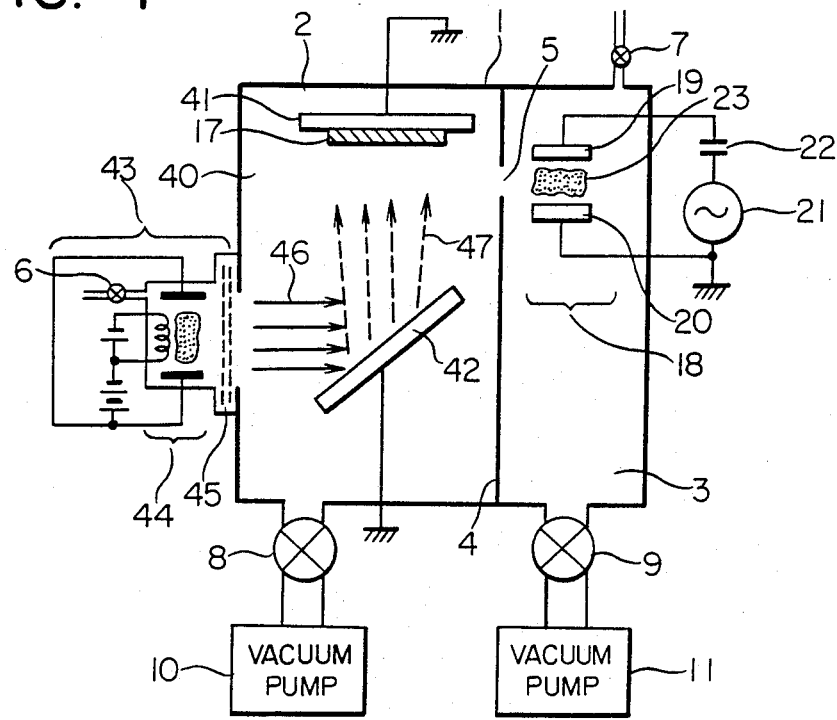
FIG. 4 is a schematic view of a fourth embodiment of the present invention in which the film-forming means is in the form of an ion beam sputtering device.

FIG. 4 schematically illustrates a fourth embodiment of the present invention which employs an ion beam sputtering device 40 as the means for forming a thin film in a first reaction chamber 2. A grounded substrate holder 41 which supports a substrate 17 and a target 42 of the ion beam sputtering device 40 are disposed within the first reaction chamber 2. An ion source 43 comprising an ion-forming chamber 44 equipped with a rare gas intake valve 6 and an accelerating electrode 45 for extracting ions is mounted on the outside of the first reaction chamber 2 and communicates with the inside thereof. During operation of the ion beam sputtering device 40, a rare gas ion beam 46 which is extracted from the ion source 43 strikes the target 42, and sputtered particles 47 from the target 42 are sputtered towards the substrate 17 and accumulate thereon as a thin film. The orifice 5 formed in the partition 4 between the first reaction chamber 2 and the second reaction chamber 3 is positioned such that reactive gas atoms which are generated in the second reaction chamber 3 will be introduced into a region of the first reaction chamber 2 in which they will combine with the sputtered particles 47 and accumulate on the substrate 17 as a chemical compound thin film. The structure of this embodiment is otherwise the same as that of the embodiment of FIG. 1, and the same effects are obtained.

Figure 5:
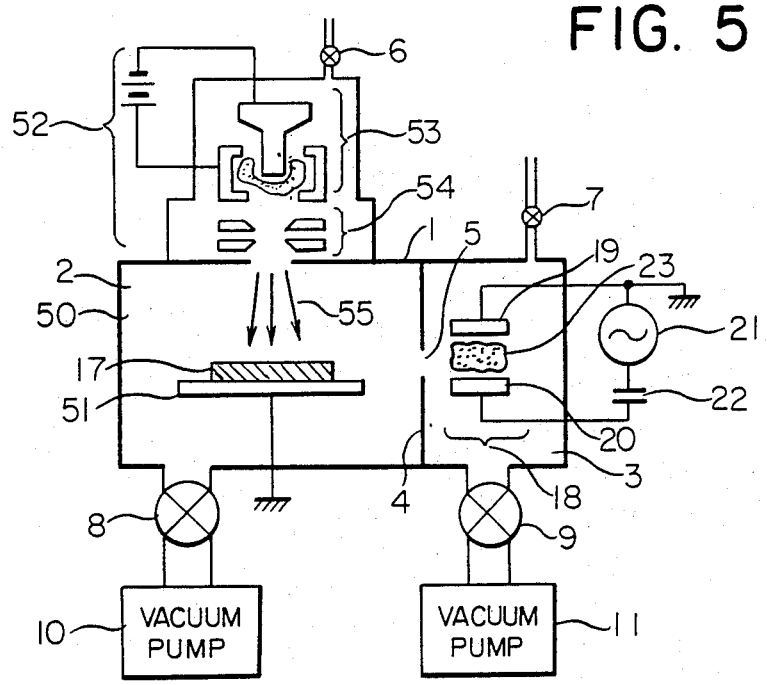
FIG. 5 is a schematic view of a fifth embodiment of the present invention in which the film-forming means is in the form of an ion beam vapor deposition device.

FIG. 5 schematically illustrates a fifth embodiment of the present invention in which the means for forming a thin film in a first reaction chamber 2 is an ion beam vapor deposition device 50. The ion beam vapor deposition device 50 has an ion source 52 which is mounted on the outside of the first reaction chamber 2 and which comprises an ion-forming chamber 53 equipped with a rare gas intake valve 6 and an accelerating electrode 54 for extracting ions. The ion source 52 communicates with the inside of the first reaction chamber 2 through an opening through which the anion beam 55 generated in chamber 53 passes. A grounded substrate holder 51 which supports a substrate 17 is disposed inside the first reaction chamber 2 opposite the opening for the ion beam 55. The structure of this embodiment is otherwise the same as that of the embodiment of FIG. 1, and it provides the same effects.

Figure 6:
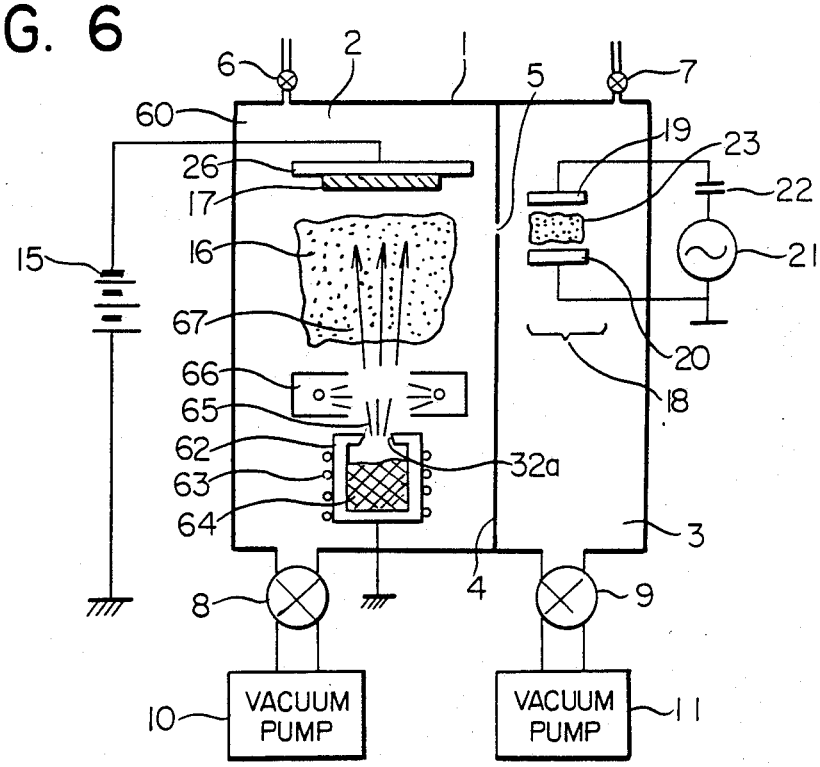
FIG. 6 is a schematic view of a sixth embodiment of the present invention in which the film-forming means is in the form of a cluster ion beam vapor deposition device.

FIG. 6 schematically illustrates a sixth embodiment of the present invention in which the means for forming a thin film in a first reaction chamber 2 is a cluster ion beam vapor deposition device 60. A cathode 61 which supports a substrate 17 is connected to a high-voltage direct current power supply 15. A grounded crucible 62 which contains a vapor deposition material 64 is equipped with a heater 63 for heating the vapor deposition material 64. A cluster ion beam 65 which is generated by the crucible 62 exits through the mouth 62a of the crucible 62 and passes through an electron shower 66 to form a molecular beam 67. A film-forming region 16 is formed within the first reaction chamber 2 between the electron shower 66 and the substrate 17, and an orifice 5 is formed in a partition 4 in the proximity of the film-forming region 16 so that reactive gas atoms from a second reaction chamber 3 which enter the first reaction chamber 2 will enter the film-forming region 16. The structure of this embodiment is otherwise the same as that of the embodiment of FIG. 1, and the same effects are obtained.

Figure 7:
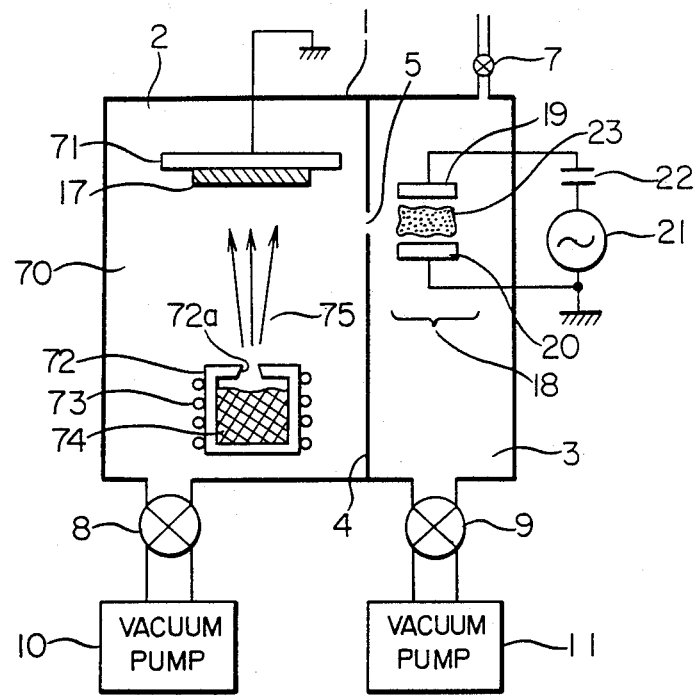
FIG. 7 is a schematic view of a seventh embodiment of the present invention in which the film-forming means is in the form of a molecular beam epitaxy device.

FIG. 7 schematically illustrates a seventh embodiment of the present invention in which the means for forming a thin film in a first reaction chamber 2 is a molecular beam epitaxy device 70. The molecular beam epitaxy device 70 comprises a grounded substrate holder 71 which supports a substrate 17 and a crucible 72 which holds a vapor deposition material 74 and is equipped with a heater 73. A molecular beam 72 which issues from the vapor deposition material 74 when heated passes through the mouth 72a of the crucible 72 and is directed at the substrate 17. In this embodiment, the first reaction chamber 2 does not require an intake valve 6, but the structure is otherwise the same as that of the embodiment of FIG. 1, and it provides the same effects.

Although various examples of means for forming a thin film on a substrate in a first reaction chamber have been described, other film-forming devices can be employed in the present invention with the same effects.

What is claimed is:

1. A film-forming apparatus comprising:
   a first reaction chamber;
   a second reaction chamber communicating with said first reaction chamber through an orifice formed in said first reaction chamber;
   film-forming means for forming a thin film on a substrate in said first reaction chamber, said film-forming means creating a film-forming region in the vicinity of said substrate in said first reaction chamber containing particles capable of combining with a reactive element to form a chemical compound; and
   reactive atom generating means for generating reactive atoms in said second reaction chamber, said reactive atom generating means creating a reactive atom generating region containing reactive atoms capable of combining with said particles in said film-forming region, said orifice being located in the vicinity of said film-forming region in said first reaction chamber and said reactive atom generating region in said second reaction chamber, said reactive atom generating means comprising:
   an anode and a cathode disposed in said second reaction chamber opposing each other across a gap, said cathode containing a reactive element;
   a high-frequency power supply connected between said anode and said cathode; and means for introducing a gas into said second reaction chamber.

2. A film-forming apparatus as claimed in claim 1 wherein said first and second reaction chamber are formed from a single housing having a partition which divides it into two compartments, one of which serves as said first reaction chamber and the other of which serves as said second reaction chamber, said orifice being an orifice which is formed in said partition.

3. A film-forming apparatus as claimed in claim 1 wherein said film-forming means comprises a sputtering device.

4. A film-forming apparatus as claimed in claim 1 wherein said film-forming means comprises an ion plating device.

5. A film-forming apparatus as claimed in claim 1 wherein said film-forming means comprises a vacuum deposition device.

6. A film-forming apparatus as claimed in claim 1 wherein said film-forming means comprises an ion beam sputtering device.

7. A film-forming apparatus as claimed in claim 1 wherein said film-forming means comprises an ion beam vapor deposition device.

8. A film-forming apparatus as claimed in claim 1 wherein said film-forming means comprises a cluster ion beam vapor deposition device.

9. A film-forming apparatus as claimed in claim 1 wherein said film-forming means comprises a molecular beam epitaxy apparatus.

* * * * *